(12) United States Patent
Misra et al.

(10) Patent No.: US 9,214,580 B2
(45) Date of Patent: Dec. 15, 2015

(54) MULTI-JUNCTION SOLAR CELL WITH DILUTE NITRIDE SUB-CELL HAVING GRADED DOPING

(75) Inventors: Pranob Misra, Stanford, CA (US); Rebecca Elizabeth Jones, Mountain View, CA (US); Ting Liu, San Jose, CA (US); Ilya Fushman, Palo Alto, CA (US); Homan Bernard Yuen, Sunnyvale, CA (US)

(73) Assignee: Solar Junction Corporation, San Jose, CA (US)

( * ) Notice: Subject to any disclaimer, the term of this patent is extended or adjusted under 35 U.S.C. 154(b) by 299 days.

(21) Appl. No.: 12/914,710

(22) Filed: Oct. 28, 2010

(65) Prior Publication Data

US 2012/0103403 A1    May 3, 2012

(51) Int. Cl.
*H01L 31/0687* (2012.01)
*H01L 31/0304* (2006.01)

(52) U.S. Cl.
CPC .... *H01L 31/03042* (2013.01); *H01L 31/03048* (2013.01); *H01L 31/0687* (2013.01); *Y02E 10/544* (2013.01)

(58) Field of Classification Search
CPC ............... H01L 31/06875; H01L 31/03048; H01L 31/03044; H01L 31/1848; H01L 31/1856
USPC ............. 136/255, 249, 262; 438/478, 57; 257/E31.014
See application file for complete search history.

(56) References Cited

U.S. PATENT DOCUMENTS

| | | | |
|---|---|---|---|
| 4,404,421 | A | 9/1983 | Fraas |
| 4,881,979 | A | 11/1989 | Lewis |

(Continued)

FOREIGN PATENT DOCUMENTS

| | | |
|---|---|---|
| JP | 63100781 A | 5/1988 |
| JP | 06061513 | 3/1994 |

(Continued)

OTHER PUBLICATIONS

Bank, et al., "Molecular-beam epitaxy growth of low-threshold cw GaInNAsSb lasers at 1.5 μm," pp. 1337-1340, J. Vac. Sci. Technol. B 23(3), May/Jun. 2005.

(Continued)

*Primary Examiner* — Jonathan Johnson
*Assistant Examiner* — Andrew Golden

(57) ABSTRACT

A lattice-matched solar cell having a dilute nitride-based sub-cell has exponential doping to thereby control current-carrying capacity of the solar cell. Specifically a solar cell with at least one dilute nitride sub-cell that has a variably doped base or emitter is disclosed. In one embodiment, a lattice matched multi junction solar cell has an upper sub-cell, a middle sub-cell and a lower dilute nitride sub-cell, the lower dilute nitride sub-cell having doping in the base and/or the emitter that is at least partially exponentially doped so as to improve its solar cell performance characteristics. In construction, the dilute nitride sub-cell may have the lowest bandgap and be lattice matched to a substrate, the middle cell typically has a higher bandgap than the dilute nitride sub-cell while it is lattice matched to the dilute nitride sub-cell. The upper sub-cell typically has the highest bandgap and is lattice matched to the adjacent sub-cell. In further embodiments, a multi junction solar cell according to the invention may comprise four, five or more sub-cells in which the one or more sub-cells may each comprise exponentially doped dilute nitride alloys.

16 Claims, 11 Drawing Sheets

(56) References Cited

U.S. PATENT DOCUMENTS

| | | | |
|---|---|---|---|
| 4,935,384 A | 6/1990 | Wanlass | |
| 5,009,719 A | 4/1991 | Yoshida | |
| 5,016,562 A | 5/1991 | Madan et al. | |
| 5,166,761 A | 11/1992 | Olson et al. | |
| 5,223,043 A | 6/1993 | Olson et al. | |
| 5,316,593 A | 5/1994 | Olson et al. | |
| 5,342,453 A | 8/1994 | Olson et al. | |
| 5,376,185 A | 12/1994 | Wanlass | |
| 5,405,453 A | 4/1995 | Ho et al. | |
| 5,689,123 A | 11/1997 | Major et al. | |
| 5,800,630 A | 9/1998 | Vilela et al. | |
| 5,911,839 A | 6/1999 | Tsai et al. | |
| 5,935,345 A | 8/1999 | Kuznicki | |
| 5,944,913 A | 8/1999 | Hou et al. | |
| 6,150,603 A | 11/2000 | Karam et al. | |
| 6,252,287 B1 | 6/2001 | Kurtz et al. | |
| 6,281,426 B1 | 8/2001 | Olson et al. | |
| 6,340,788 B1 | 1/2002 | King et al. | |
| 6,504,091 B2 | 1/2003 | Hisamatsu et al. | |
| 6,617,618 B2 | 9/2003 | Sato | |
| 6,660,928 B1 | 12/2003 | Patton et al. | |
| 6,756,325 B2 | 6/2004 | Bour et al. | |
| 6,764,926 B2 | 7/2004 | Takeuchi et al. | |
| 6,765,238 B2 | 7/2004 | Chang et al. | |
| 6,787,385 B2 | 9/2004 | Barber et al. | |
| 6,815,736 B2 | 11/2004 | Mascarenhas | |
| 6,951,819 B2 | 10/2005 | Iles et al. | |
| 7,071,407 B2 | 7/2006 | Faterni et al. | |
| 7,119,271 B2 | 10/2006 | King et al. | |
| 7,122,733 B2 | 10/2006 | Narayanan et al. | |
| 7,122,734 B2 | 10/2006 | Fetzer et al. | |
| 7,123,638 B2 | 10/2006 | Leary et al. | |
| 7,126,052 B2 | 10/2006 | Fetzer et al. | |
| 7,255,746 B2 | 8/2007 | Johnson et al. | |
| 7,279,732 B2 | 10/2007 | Meng et al. | |
| 7,709,287 B2 | 5/2010 | Fatemi et al. | |
| 7,727,795 B2 | 6/2010 | Stan et al. | |
| 7,807,921 B2 | 10/2010 | Fetzer et al. | |
| 7,842,881 B2 | 11/2010 | Comfeld et al. | |
| 8,067,687 B2 | 11/2011 | Wanlass | |
| 8,575,473 B2 | 11/2013 | Jones et al. | |
| 2002/0000546 A1 | 1/2002 | Sato | |
| 2002/0195137 A1 | 12/2002 | King et al. | |
| 2003/0070707 A1 | 4/2003 | King et al. | |
| 2003/0145884 A1 | 8/2003 | King et al. | |
| 2004/0045598 A1 | 3/2004 | Narayanan et al. | |
| 2004/0130002 A1 | 7/2004 | Weeks et al. | |
| 2004/0200523 A1 | 10/2004 | King et al. | |
| 2005/0155641 A1 | 7/2005 | Fafard | |
| 2005/0274409 A1 | 12/2005 | Fetzer et al. | |
| 2006/0144435 A1 | 7/2006 | Wanlass | |
| 2006/0162768 A1 | 7/2006 | Wanlass et al. | |
| 2007/0034853 A1 | 2/2007 | Robbins et al. | |
| 2007/0131275 A1 | 6/2007 | Kinsley et al. | |
| 2007/0227588 A1 | 10/2007 | Gossard et al. | |
| 2008/0035939 A1 | 2/2008 | Puetz et al. | |
| 2008/0149173 A1 | 6/2008 | Sharps | |
| 2008/0245400 A1 | 10/2008 | Li | |
| 2008/0257405 A1 | 10/2008 | Sharps | |
| 2009/0001412 A1 | 1/2009 | Nagai et al. | |
| 2009/0014061 A1* | 1/2009 | Harris et al. | 136/255 |
| 2009/0057721 A1 | 3/2009 | Miura et al. | |
| 2009/0078310 A1 | 3/2009 | Stan et al. | |
| 2009/0145476 A1 | 6/2009 | Fetzer et al. | |
| 2009/0155952 A1* | 6/2009 | Stan et al. | 438/94 |
| 2009/0229659 A1 | 9/2009 | Wanlass et al. | |
| 2009/0255575 A1 | 10/2009 | Tischler | |
| 2009/0255576 A1 | 10/2009 | Tischler | |
| 2009/0272438 A1 | 11/2009 | Cornfeld | |
| 2009/0288703 A1 | 11/2009 | Stan et al. | |
| 2010/0087028 A1 | 4/2010 | Porthouse et al. | |
| 2010/0096001 A1 | 4/2010 | Sivananthan et al. | |
| 2010/0180936 A1 | 7/2010 | Kim | |
| 2010/0218819 A1 | 9/2010 | Farmer et al. | |
| 2010/0282305 A1 | 11/2010 | Sharps et al. | |
| 2010/0282306 A1 | 11/2010 | Sharps et al. | |
| 2010/0319764 A1 | 12/2010 | Wiemer et al. | |
| 2011/0023958 A1 | 2/2011 | Masson et al. | |
| 2011/0114163 A1 | 5/2011 | Wiemer et al. | |
| 2011/0210313 A1 | 9/2011 | Fuji et al. | |
| 2011/0232730 A1 | 9/2011 | Jones et al. | |
| 2011/0303268 A1 | 12/2011 | Tan et al. | |
| 2012/0031478 A1 | 2/2012 | Boisvert et al. | |
| 2012/0103403 A1 | 5/2012 | Misra et al. | |
| 2012/0211071 A1 | 8/2012 | Newman et al. | |
| 2012/0216858 A1 | 8/2012 | Jones-Albertus et al. | |
| 2012/0216862 A1 | 8/2012 | Abou-Kandil et al. | |
| 2012/0227797 A1 | 9/2012 | Stan et al. | |
| 2012/0285526 A1 | 11/2012 | Jones-Albertus et al. | |
| 2013/0014815 A1 | 1/2013 | Jones et al. | |
| 2013/0118546 A1 | 5/2013 | Jones-Albertus et al. | |
| 2013/0118566 A1 | 5/2013 | Jones-Albertus et al. | |
| 2013/0220409 A1 | 8/2013 | Jones-Albertus et al. | |

FOREIGN PATENT DOCUMENTS

| | | |
|---|---|---|
| JP | 06061516 | 3/1994 |
| JP | 10012905 | 1/1998 |
| WO | 2010/151553 A1 | 12/2010 |
| WO | 2011/062886 A1 | 5/2011 |
| WO | 2011/123164 A1 | 10/2011 |
| WO | 2012/057874 A1 | 5/2012 |
| WO | 2012/115838 A2 | 8/2012 |
| WO | 2012/154455 A1 | 11/2012 |

OTHER PUBLICATIONS

Bertness et al., "29.5%-Efficient GaInP/GaAs Tandem Solar Cells," Applied Physics Letters, vol. 65, Aug. 22, 1994, pp. 989-991.

Cotal et al., "III-V multijunction solar cells for concentrating photovoltaics" pp. 174-192, www.rsc.org/ees, Energy and Environmental Science 2, (2009).

Ferguson et al., Nonradiative Recombination in 1.56 μm GaIn-NAsSb/GaNAs Quantum-Well Lasers, pp. 1-3, published online Dec. 8, 2009, Applied Physics Letters 95, 231104 (2009).

Fewster P.F., "X-Ray Scattering From Semiconductors" Second Edition, Imperial College Press, London, 2003, Ch. 1, pp. 1-22.

Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.

Friedman et al., "Analysis of Depletion-Region Collection in GaIn-NAs Solar Cells," pp. 691-694, Conference Record of the Thirty-first IEEE Photovoltaic Specialists Conference, Lake Buena Vista, Florida, Jan. 3-7, 2005.

Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).

Green et al., Progress in Photovoltaics: Research and Applications 19 (2011) pp. 565-572.

Green et al., Progress in Photovoltaics: Research and Applications 20 (2012) pp. 12-20.

Green, "Third Generation Photovoltaics: Advanced Solar Energy Conversion," pp. 95-109, Springer Publishing, Berlin, Germany (2003).

Gu et al., "Gas Source Growth and Doping Characteristics of AlInP on GaAs" Materials Science and Engineering B 131 (2006), pp. 49-53.

Harris Jr. et al., "Development of GaInNAsSballoys: Growth, band structure, optical properties and applications," 2007, Physics Status Solidi(b), vol. 244, Issue 8, pp. 2707-2729, Jul. 6, 2007.

Hovel H.J., "Semiconductors and Semimetals", Academic Press, New York, 1975, Ch. 2, pp. 8-47.

Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.

Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.

(56) References Cited

OTHER PUBLICATIONS

King et al., "High-Voltage, Low-Current GaInP/GaInP/GaAs/GaIn-NAs/Ge Solar Cells" Spectrolab Inc., 2002, pp. 852-855.
King et al., "40% Efficient Metamorphic GaInP/GaInAs/Ge Multijunction Solar Cells," J. of Applied Physics Letters, May 4, 2007, 3 pages.
Kudrawiec, "Contactless electroreflectance of GaInNAsSb/GaAs single quantum wells with indium content of 8%-32%", Jan. 2007, Journal of Applied Physics, vol. 101, pp. 013504-1-013504-9.
Kurtz et al., "Projected Performance of Three and Four-Junction Devices Using GaAs and GaInP," pp. 875-878, 26th IEEE Photovoltaics Specialists Conference, (1997).
Merrill et al., Directions and Materials Challenges in High Performance Photovoltaics, Dec. 2007, JOM Energetic Thin Films, 59, 12, 26-30.
Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.
Miyashita et al., "Improvement of GaInNAsSb films fabricated by atomic hydrogen-assisted molecular beam epitaxy", pp. 3249-3251, Journal of Crystal Growth 311, 2009.
Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.
Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).
Ptak et al., "Defects in GaInNAs: What We've Learned so Far" National Renewable Energy Laboratory NREL/CP-520-33555, May 2003, 7 pages.
Sabnis et al., A new roadmap for space solar cells, Industry Photovoltaics, www.compoundsemiconductor.net/csc/features-details/19735471, Aug./Sep. 2012, 5 pages.
Solar Junction Inc, "Sharp Develops Solar Cell with Word's Highest Conversion Efficiency of 35.8%" Press Release, dated Oct. 22, 2009, 3 pages.
Volz et al., MOVPE growth of dilute nitride III/V semiconductors using all liquid metalorganic precursors, Journal of Crystal Growth 311 (2009), pp. 2418-2526.
Wiemer et al., "43.5% Efficient Lattice Matched Solar Cells" Proc. SPIE 810804 (2011), 5 pages.
Wistey et al., Nitrogen Plasma Optimization for High-Quality Dilute Nitrides, pp. 229-233, Journal of Crystal Growth, available online on Feb. 1, 2005 at http://www.sciencedirect.com.
International Search Report and Written Opinion PCT/US2008/008495 mailed Apr. 6, 2009, 5 pages.
International Preliminary Report on Patentability PCT/US2008/008495 dated Jan. 12, 2010, 5 pages.
International Search Report and Written Opinion corresponding to the PCT application No. PCT/US10/39534, date of mailing Sep. 8, 2010, 8 pages.
International Search Report and Written Opinion corresponding to the PCT application No. PCT/US2010/061635, date of mailing Mar. 1, 2011, 7 pages.
International Preliminary Report on Patentability for PCT Application No. PCT/US2010/056800, mailed on May 31, 2012, 6 pages.
International Search Report and Written Opinion of the International Searching Authority for PCT Application No. PCT/US12/36020, mailed on Aug. 14, 2012, 11 pages.
International Search Report and Written Opinion of the International Searching Authority for PCT Application No. PCT/US12/25307, mailed on Aug. 16, 2012, 13 pages.
Non-Final Office Action of Jun. 10, 2010 for U.S. Appl. No. 12/217,818, 15 pages.
Final Office Action of Jan. 1, 2011 for U.S. Appl. No. 12/217,818, 15 pages.
Non-Final Office Action of Oct. 5, 2012 for U.S. Appl. No. 12/944,439, 15 pages.
Non-Final Office Action of Oct. 24, 2012 for U.S. Appl. No. 12/749,076, 17 pages.
Friedman et al., *Breakeven Criteria for the GaInNAs Junction in GaInP/GaAs/GaInNAs/Ge Four-junction Solar Cells*, pp. 331-344, Progress in Photovoltaics: Research and Applications. (2002).
Garcia et al., *Analysis of Tellurium as N-Type Dopant in GaInP: Doping, Diffusion, Memory Effect and Surfactant Properties*, pp. 794-799, Journal of Crystal Growth 298 (2007), www.sciencedirect.com Available online Dec. 4, 2006.
Geelen et al., *Epitaxial Lift-Off GaAs Solar Cell From a Reusable GaAs Substrate*, pp. 162-171, Materials Science and Engineering B45 (1997).
Green, *Do Built-in Fields Improve Solar Cell Performance?* pp. 57-66, Progress in Photovoltaics: Research and Applications (2009), Published online in Wiley InterScience (www.interscience.wiley.com) on Oct. 1, 2008.
Jackrel et al., *Dilute nitride GainNAs and GainNAsSb solar cells by molecular beam epitaxy*, pp. 1-8, Journal of Applied Physics 101, 114916, (2007).
Janotti et. al., *Mutual Passivation of Electrically Active and Isovalent Impurities in Dilute Nitrides*, Physical Review Letters 100, 045505 (2008).
Ng et al., *IEV $GAN_xAS_{1-x-y}SB_y$ Material for Lattice-Matched III-V Solar Cell Implementation on GAAS and GE*, pp. 76-80, (2009).
Ptak et al., *Low-acceptor-Concentration GInNAs grown by Molecular-beam Epitaxy for High-current p-i-n solar cell applications*, Journal of Applied Physics 98, 094501 (2005).
Volz et al., *Optimization of Annealing Conditions of (GaIn)(NAs) for Solar Cell Applications*, pp. 2222-2228, Journal of Crystal Growth 310 (2008) www.sciencedirect.com Available online Dec. 4, 2007.
Wu et al., *Band Anticrossing in Highly Mismatched III-V Semiconductor Alloys*, pp. 860-869, Semiconductor Science and Technology 17 (2002).
Yu et. al., *Mutual Passivation of Group IV Donors and Nitrogen in Diluted $GaN_xAs_{1-x}$ Alloys*, pp. 2844-2846, Applied Physics Letters, vol. 83, No. 14 (Oct. 6, 2003).
International Search Report and Written Opinion corresponding to the PCT application No. PCT/US10/56800, date of mailing Jan. 26, 2011, 8 pages total.
Yamaguchi et al., "*Multi-junction III-V solar cells: current status and future potential*", in: Solar Energy, vol. 79, issue 1, Jul. 2005, Abstract [online]. [Retrieved on Jan. 12, 2011 from the Internet] at URL: <http://www.sciencedirect.com/science?_ob=ArticleURL&_udi=B6V50-4DNW4BV-3&_user=10&_coverDate=07%2F31%2F2005&_rdoc=1&_fmt=high&_orig=search&_origin=search&_sort=d&_docanchor=&view=c&_search StrId=1605061367&_rerunOrigin=scholar.google&_acct=C000050221&_version=1&_urlVersion=0&_userid=10&md5=d794dede36e6c73a9dc0c9b7e27d43a2&searchtype=a>.
International Search Report and Written Opinion corresponding to the PCT application No. PCT/US11/36486, date of mailing Aug. 25, 2011, 12 pages total.
Cornfeld et al., "Evolution of a 2.05 eV AlGaInP top Sub-cell for 5 and 6J-IMM Applications", Photovoltaic Specialists Conference (PVSC), 38th IEEE, Jun. 3, 2012, p. 2788-2791.
Patton et al., "Development of a High Efficiency Metamorphic Triple-junction 2.1 eV/1.6 eV/1.2 eV AlGaInP/InGaAsP/InGaAs Space Solar Cell", Conference Record of the IEEE Photovoltaic Specialists Conference, Institute of Electrical and Electronics Engineers Inc., May 19, 2002, vol. 29, p. 1027-1030.
Denton et al., Vegard's Law, Physical Review, A, The American Physical Society, vol. 43 No. 6, pp. 3161-3164 (1991).
Law et al., "Future technology pathways of terrestrial III-V multijunction solar cells for concentrator photovoltaic systems," Solar Energy Materials & Solar Cells 94 (2010) pp. 1314-1318.
Friedman et al., "1-eV Solar cells with GaInNAs active layer", Journal of Crystal Growth, vol. 195, 1998, p. 409-415.
Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.
E. Wesoff, "Update: Solar Junction breaking CPV efficiency records, raising $30M", Greentech Media, Apr. 15, 2011, 4 pages.

(56) References Cited

OTHER PUBLICATIONS

E. Wesoff, "CPV Roundup: SolFocus funding, 5MW order for Solar Junction, GreenVolts, Amonix", Greentech Media, May 22, 2012, 3 pages.
E. Wesoff, "Record 44 percent CPV efficiency from startup Solar Junction", Greentech Media, Oct. 15, 2012, 3 pages.
Weyers et al., "Red shift of photoluminescence and absorption in dilute GaAsN alloy layers", Japan Journal of Applied Physics, vol. 31, Issue 7A, 1992, p. L853-L855.
International Search Report and Written Opinion for PCT Application No. PCT/US2013/033567, mailed on Mar. 4, 2014, 12 pages.
Non-Final Office Action dated Nov. 8, 2012 for U.S. Appl. No. 13/104,913, 12 pages.
Non-Final Office Action dated Dec. 14, 2012 for U.S. Appl. No. 13/618,496, 16 pages.
Final Office Action dated Feb. 6, 2013 for U.S. Appl. No. 13/618,496, 8 pages.
Non-Final Office Action dated Feb. 13, 2013 for U.S. Appl. No. 12/819,534, 8 pages.
Notice of Allowance dated Mar. 22, 2013 for U.S. Appl. No. 13/618,496, 8 pages.
Non-Final Office Action dated Apr. 15, 2013 for U.S. Appl. No. 12/708,763, 23 pages.
Non-Final Office Action dated Apr. 25, 2013 for U.S. Appl. No. 13/708,791, 16 pages.
Non-Final Office Action dated May 24, 2013 for U.S. Appl. No. 13/739,989, 7 pages.
Final Office Action of May 29, 2013 for U.S. Appl. No. 12/944,439, 17 pages.
Final Office Action dated Sep. 9, 2013 for U.S. Appl. No. 13/819,534, 13 pages.
Final Office Action of May 29, 2013 for U.S. Appl. No. 12/944,439, 11 pages.
Final Office Action dated Oct. 2, 2013 for U.S. Appl. No. 13/104,913, 12 pages.
Final Office Action dated Oct. 1, 2013 for U.S. Appl. No. 13/708,791, 15 pages.
Amendment, Affidavits under 37 C.F.R. §132, and Information Disclosure Statement filed Nov. 2013 for U.S. Appl. No. 13/739,989, 51 pages.
Final Office Action maield Feb. 26, 2014, for U.S. Appl. No. 13/739,989, 16 pages.
Non-Fnial Office Action mailed on Dec. 31, 2013, for U.S. Appl. No. 13/370,500, 7 pages.
Notice of Allowance mailed Feb. 21, 2014, for U.S. Appl. No. 13/104,913, 8 pages.
Non-Final Office Action mailed Feb. 20, 2014, for U.S. Appl. No. 13/678,389, 13 pages.
Notice of Allowance mailed Feb. 20, 2014, for U.S. Appl. No. 13/708,763, 9 pages.
Non-Final Office Action mailed on Mar. 21, 2014, for U.S. Appl. No. 13/442,146, 6 pages.
U.S. Appl. No. 12/819,534, Final Office Action mailed on Sep. 9, 2013, 13 pages.
U.S. Appl. No. 12/944,439, Non-Final Office Action mailed on Aug. 13, 2014, 11 pages.
Japanese Application No. 2012-517662, Office Action mailed on Apr. 30, 2013, 5 pages (English translation).
Japanese Application No. 2013-502560, Office Action mailed on May 7, 2014, 5 pages (English translation).
Japanese Application No. 2013-536607, Office Action mailed on Mar. 18, 2014, 6 pages (English translation).
Bhuiyan et al., InGaN Solar Cells: Present State of the Art and Important Challenges, IEEE Journal of Photovoltaics, vol. 2, No. 3, Jul. 2012, pp. 246-293.
Miller et al., GaAs—AlGaAs tunnel junctions for multigap cascade solar cells, Journal of Applied Physics, vol. 53, No. 1, Jan. 1982, pp. 744-748.
Yuen, "The role of antimony on properties of widely varying GaInNAsSb compositions", Journal of Applied Physics, May 2006, vol. 99, p. 093504-1 to 093804-8.

\* cited by examiner

MULTI-JUNCTION SOLAR CELL WITH DILUTE NITRIDE SUB-CELL HAVING GRADED DOPING

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The invention relates to solar cell design and more particularly to multi junction solar cells employing dilute nitrides.

The highest solar cell efficiencies are known to be produced by multi junction (MJ) solar cells comprising III-V semiconductor alloys. Their relatively higher efficiencies make these devices attractive for both terrestrial concentrating photovoltaic systems and for celestial systems designed to operate in outer space. Multi junction solar cells have reached efficiencies up to 41.6% under concentrations equivalent to several hundred suns. Currently, the highest efficiency devices have three junctions and are either lattice matched to their substrate or contain metamorphic layers that are not lattice matched. Other factors equal, lattice-matched systems are preferable because they have proven reliability and require less semiconductor material than metamorphic solar cells, which require thick buffer layers to accommodate the differing lattice constants of adjacent materials.

Dilute nitrides are a class of III-V alloy materials (alloys having one or more elements from Group III on the periodic table along with one or more elements from Group V on the periodic table) with small fractions (e.g., <5 atomic percent) of nitrogen. These alloys are of interest for multi junction solar cells because they can be lattice matched to substrates of interest, including GaAs and Ge. Additionally, one can achieve a bandgap of 1 eV for the dilute nitride material, which is ideal for integration into a multi junction solar cell with substantial efficiency improvements.

GaInNAs, GaNAsSb and GaInNAsSb are some of the dilute nitride materials that have been studied as potentially useful for multi-junction solar cells (see, e.g., A. J. Ptak et al., *Journal of Applied Physics* 98 (2005) 094501 and Yoon et al., *Photovoltaic Specialists Conference* (PVSC), 2009 34th IEEE, pp 76-80, 7-12, June 2009; doi: 10.1109/PVSC.2009.5411736). Furthermore, the use of four junction GaInP/GaAs/dilute-nitride/Ge solar cell structure holds the promise of efficiencies exceeding those of the standard metamorphic and lattice matched three-junction cell, which at present are the benchmark for high-efficiency multi-junction cell performance. (Friedman et al. *Progress in Photovoltaics: Research and Applications* 10 (2002), 331). To make that promise a reality, what is needed is a material that is lattice matched to GaAs and Ge with a band gap of near 1 eV and that produces open circuit voltage greater than 0.3 V with sufficient current to match the (Al)InGaP and (In)GaAs sub-cells in a multi-junction solar cell. It should be noted that a multi-junction solar cell for terrestrial use is integrated into a concentrated photovoltaic system. Such a system employs concentrating optics consisting of dish reflectors or Fresnel lenses that concentrate sunlight onto the solar cell. It is possible that a concentrator's optics may attenuate light in a particular wavelength region which may be detrimental to the dilute nitride sub-cell. It is therefore of utmost importance that higher current be generated in the dilute nitride sub-cell so any loss due to the concentrator optics does not inhibit the performance of the multi-junction solar cell.

In a multi-junction solar cell, each of the sub-cells is attached in series to other sub-cells, typically using tunnel junction diodes to connect the individual sub-cells to one another. Since the total current generated by the full stack of sub-cells must pass through all the sub-cells, the sub-cell passing the least amount of current will be the current-limiting cell for the entire stack, and by the same virtue, the efficiency-limiting cell. It is therefore of greatest importance that each sub-cell be current matched to the other sub-cells in the stack for best efficiency. This is particularly important if dilute nitride sub-cells are to be used because dilute nitride semiconductor materials historically have been plagued with poor minority carrier transport properties that prove detrimental when incorporated into a larger solar cell.

Although dilute nitride alloys have other properties that make them desirable for use in multi-junction structures, particularly the flexibility with which their bandgaps and lattice constants can be fine-tuned as part of their design, the minority carrier lifetime and diffusion lengths for these sub-cells are typically worse than with conventional solar cell semiconductors such as GaAs and InGaP used in conventional multi-junction solar cells, thus resulting in a loss of short circuit current, open circuit voltage or both. Moreover, the interface between the back surface field and the base of the dilute nitride sub-cell may have high surface recombination velocity, which could further reduce the short circuit current and open circuit voltage of the sub-cell. As a result of these problems, photocurrents generated in dilute nitride sub-cells are typically lower than with more traditional materials. (D. B. Jackrel et al., *Journal of Applied Physics* 101 (114916) 2007).

Dopant variation in solar cells is known. See M. A. Green, *Progress in Photovoltaics: Research and Applications* 17 (2009). U.S. Pat. No. 7,727,795 is an example of a solar cell design using exponential doping in parts of a solar cell structure, evidently for multi-junction solar cells grown in an inverted metamorphic and lattice mismatched structure. The application to dilute nitride sub-cells is not suggested and is not obvious, due to the anomalous characteristics of dilute nitrides. Dilute nitrides are a novel class of materials, which frequently exhibit different behavior than seen in traditional semiconductor alloys. For example, bandgap bowing as a function of alloy composition is very different in dilute nitrides as compared to traditional semiconductors (e.g., Wu et al., *Semicondutor Science and Technology* 17, 860 (2002)). Likewise, the standard dopants and doping profiles used for traditional semiconductors such as GaAs and InGaP do not result in comparable characteristics in dilute nitride semiconductors. For example, dopant incorporation in dilute nitrides has anomalous behavior. A Yu et. al. paper reported that when dilute nitride thin films are doped heavily with Si, the Si and N mutually passivate each other's electronic activity (Yu et. al. *App. Phys. Lett.* 83, 2844 (2003)). Similarly, Janotti et. al. (Phys. Rev. Lett. 100, 045505 (2008)) suggested that while the physics of n-type and p-type doping in the parent compounds GaAs and GaN is well established, doping in $GaAs_{1-}$ $_xN_x$ is much less explored and the interaction between extrinsic dopants and N in $GaAs_{1-x}N_x$ alloys can lead to entirely new phenomena. They also pointed that rapid thermal annealing of Si-doped dilute (In)GaAsN alloys at temperatures above 800° C. leads to a drastic increase in the electrical resistivity. Due to the uncertainties associated with doping profiles and outcomes, and due to the unique properties of dilute nitrides, it is not apparent to one of ordinary skill how the concepts taught therein could be incorporated into a solar cell employing dilute nitride elements having portions subjected to controlled doping. Moreover, due to difficulties in doping the dilute nitride alloys, the literature teaches that dilute nitride alloys should not be doped (i.e., should be intrinsic) when incorporated into solar cell structures, for enhancement of the current collection (e.g., Ptak et al. *J. Appl. Phys.* 98, 094501 (2005); Volz et al. *J. Crys. Growth* 310, 2222 (2008)). Rather, the literature teaches that the use of doping in the base of the dilute nitride solar cell leads to decreased performance.

Known as well, as previously discussed, dilute nitride cells were thought to have significant drawbacks such that their incorporation into multi-junction solar cells would have led to substantial loss in the efficiency of such a solar cell, thus making dilute nitride cells less attractive commercially than other types of materials. It is desirable to improve current collection in dilute nitride based sub-cells without an accompanying loss of short circuit current, open circuit voltage or both.

SUMMARY OF THE INVENTION

According to the invention, a lattice-matched solar cell having a dilute nitride-based sub-cell has a graded doping profile in all or part of the dilute nitride layer, a graded doping profile being defined as a doping profile wherein the concentration of dopant increases or decreases from the top to bottom of the layer, where top and bottom are defined relative to the orientation of the solar cell in operation, the top being closest to the radiation source. Specifically a solar cell with at least one dilute nitride sub-cell that has a base or emitter with graded doping is disclosed. In one embodiment, a lattice matched multi-junction solar cell has an upper sub-cell, a middle sub-cell and a lower dilute nitride sub-cell, the lower dilute nitride sub-cell having graded doping in the base and/or the emitter so as to improve its solar cell performance characteristics. In construction, the dilute nitride sub-cell may have the lowest bandgap and be lattice matched to a substrate; the middle cell typically has a higher bandgap than the dilute nitride sub-cell and is lattice matched to the dilute nitride sub-cell. The upper sub-cell typically has the highest bandgap and is lattice matched to the adjacent sub-cell. In further embodiments, a multi-junction solar cell according to the invention may comprise four, five or more sub-cells in which the one or more sub-cells may each contain dilute nitride alloys with a graded doping profile.

Common to all of these embodiments is a significant functional relationship between overall performance and the vertical distribution of doping in the base and/or emitter of the dilute nitride sub-cells. The doping concentration may be selected so as to have positional dependence, in which dependence varies as a function of vertical position in the base or the emitter. By way of an example, the doping could be designed to increase linearly or exponentially from the top to bottom in the base. Stated in mathematical terms, the doping concentration "d" has a functional dependence such that d=F(x) (i.e., doping is a function of position) where the x is the vertical position in the base and or emitter such that x is zero at the emitter/base junction and increases with distance from this junction. The manner and distribution of the doping (i.e., the function F) is selected to improve and ultimately to optimize the short circuit current and the open circuit voltage that would otherwise exist in the dilute nitride layer. The invention thus provides a lattice matched multi-junction solar cell containing one or more dilute nitride sub-cells and having enhanced efficiency compared to that of a multi-junction solar cell without such distribution of doping.

In one embodiment of the invention, the doping profile is changed in the base of the solar cell such that it is the least at the emitter base junction and increases away from it. The precise distribution function for the increase is chosen to gain maximum current and voltage enhancement for the dilute nitride sub-cell.

In another embodiment, the doping profile is chosen to have two sub-regions in the base, wherein no doping or uniform doping is used for the sub-region closer to the emitter-base junction and graded doping is used in the other sub-region.

The invention will be better understood by reference to the following detailed description in connection with the accompanying drawings.

DETAILED DESCRIPTION OF THE INVENTION

According to the invention, a multi-junction solar cell includes at least a dilute nitride solar sub-cell with tailored and more specifically graded doping and/or impurity concentration, as herein described. Without limiting the generality of the invention, a multi-junction solar cell having one or more dilute nitride sub-cells takes advantage of the functional dependence of sub-cell performance on the vertical distribution of doping within the base and/or emitter of the sub-cell. Graded doping indicates a functional dependence on the position in the base and/or emitter.

Figure 1:
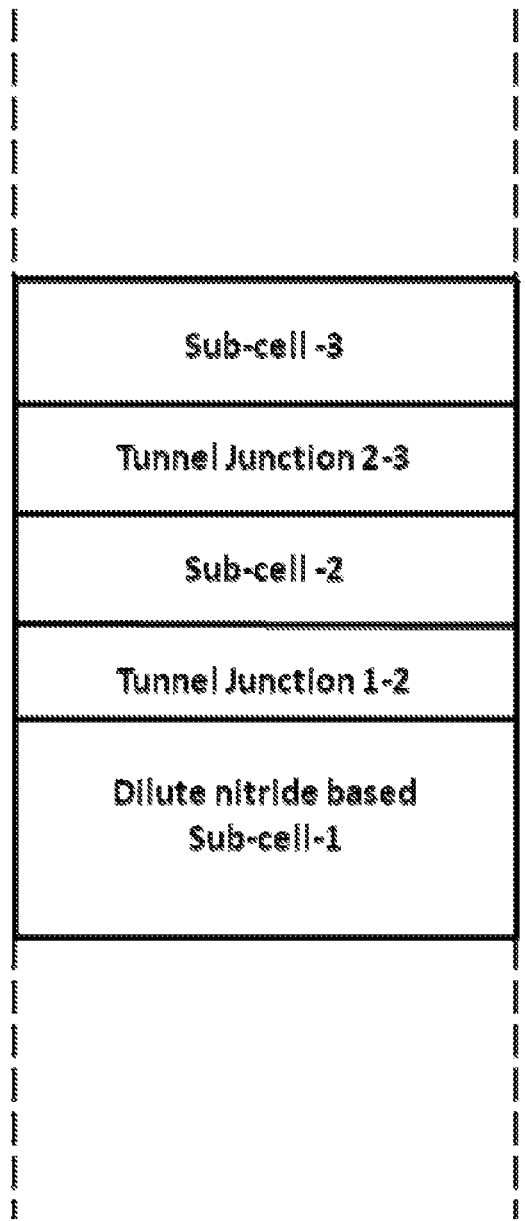
FIG. 1 shows the schematic of an exemplary triple junction solar cell with three sub-cells, of which the bottom cell is a dilute nitride sub-cell.
Figure 4:
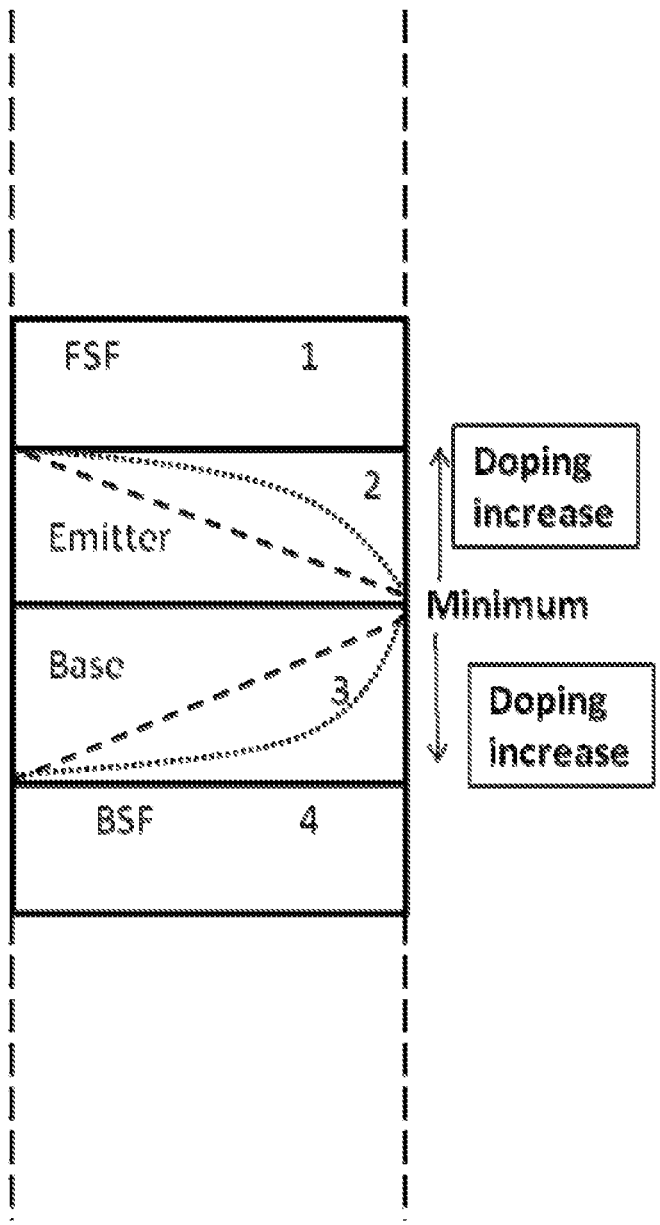
FIG. 4 shows one configuration of various layers of a dilute nitride based solar sub-cell.

FIG. 1 shows the schematic of an exemplary triple junction solar cell with three sub-cells, of which the bottom cell is a dilute nitride sub-cell. In this embodiment, the substrate can be any conventional substrate used for epitaxy selected from the group including but not limited to GaAs, Ge, InP, GaSb and comparable materials. Above the substrate, the triple junction cell has a bottom sub-cell 1, middle sub-cell 2 and the top sub-cell 3 arranged in order of increasing band gap. In the embodiment of FIG. 1, the dilute nitride cell 1 is integrated as the third junction or the bottom sub-cell of the multi-junction solar cell stack. The three solar sub-cells 1, 2, 3 are stacked in tandem and have electrical contacts on the upper surface and lower surface (beyond the regions shown in dotted lines). Each sub-cell is connected to the one above it by a tunnel junction diode 1-2, 2-3 at their boundary, which is a thin layer of an extremely highly doped p-n junction. Tunnel junctions are well known in the art and need no further definition. As described more fully below, the base and/or the emitter layer of the dilute nitride sub-cell 1 (as depicted in FIG. 4) is doped in such a way as to vary the concentration of dopant within the layer. The middle and top sub-cells 2, 3 may be constructed from any of a group of materials including but not limited to some combination of Group III and V elements including In, Ga, Al, B, N, As, P, Sb and Bi and also containing dopant elements selected from the group including but not limited to Zn, C, Be, Mg, Si, Ge, O, Se and Te.

Figure 2:
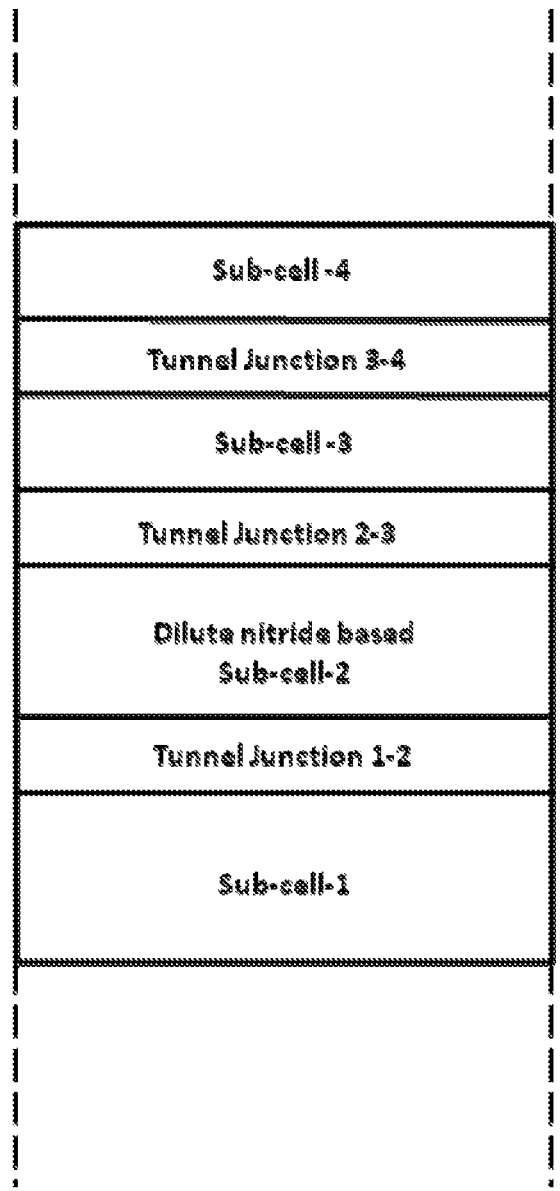
FIG. 2 shows the schematic for an exemplary four junction solar cell that includes one dilute nitride sub-cell.
Figure 3:
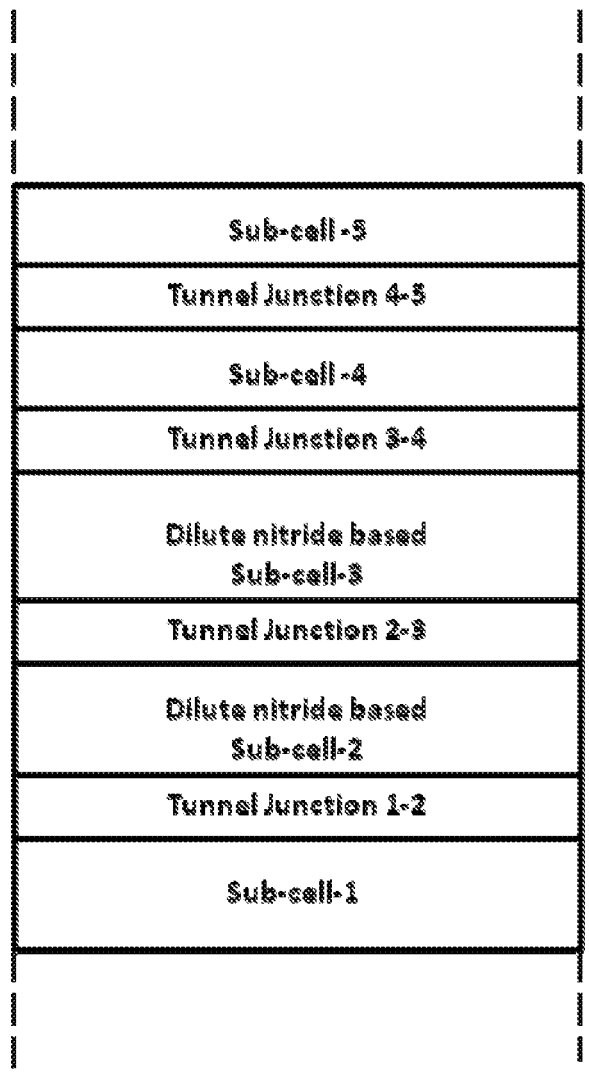
FIG. 3 shows the schematic for an exemplary five-junction solar cell including two dilute nitride sub-cells.

In other embodiments of the invention, a dilute nitride sub-cell with positional dependence of doping and/or impurity incorporation is integrated as one or more sub-cells of a four-, five- or six-junction solar cell, each sensitive to a different part of the spectrum. FIG. 2 depicts the inner layer structure of a four-junction cell with a dilute nitride sub-cell 2, in which the second sub-cell is a dilute nitride sub-cell and in which the first sub-cell may optionally be a dilute nitride sub-cell. FIG. 3 depicts an example of a five junction cell with two variably doped dilute nitride sub-cells 2, 3. The utility of the invention is not limited to the designs outlined in FIGS. 1, 2 and 3 but may be used in any compatible solar cell wherein the number of junctions exceeds two and a dilute nitride alloy can be used as one or more sub-cells.

In one embodiment, the dilute nitride sub-cell is a solar cell with its base and/or emitter comprising a dilute nitride material. The cross section for an exemplary dilute nitride sub-cell is shown in FIG. 4. Specifically, this sub-cell comprises multiple layers (numbered 1, 2, 3, 4) including a back surface field (BSF) (layer 4) that serves to reduce carrier recombination losses. (By convention in the solar cell art, the term "front" refers to the exterior surface of the cell that faces the radiation source and the term "back" refers to the exterior surface that is away from the source. As used in the figures of this patent application, "back" is thus synonymous with "bottom" and "front" is synonymous with "top.") Any suitable combination of Group III and Group V element may be used for the fabrication of the BSF, subject to lattice constant and bandgap constraints. On top of the BSF, the base comprising dilute nitride material is deposited. On top of the base 3, the emitter 2 comprising dilute nitride material and/or a suitable combination of Group III and Group V elements is grown. Thereafter, an optional front surface field (FSF, layer 1) is deposited on top of the emitter again comprising a suitable combination of Group III and Group V elements. Many examples of dilute nitride alloys are known in the art, as for example set forth in co-pending U.S. patent application Ser. No. 12/819,534 assigned to the assignee of the present invention. A doping or impurity concentration profile is chosen to yield the desired functional effect of varying the level of doping within the base layer 3 and/or emitter layer 2.

Figure 5:
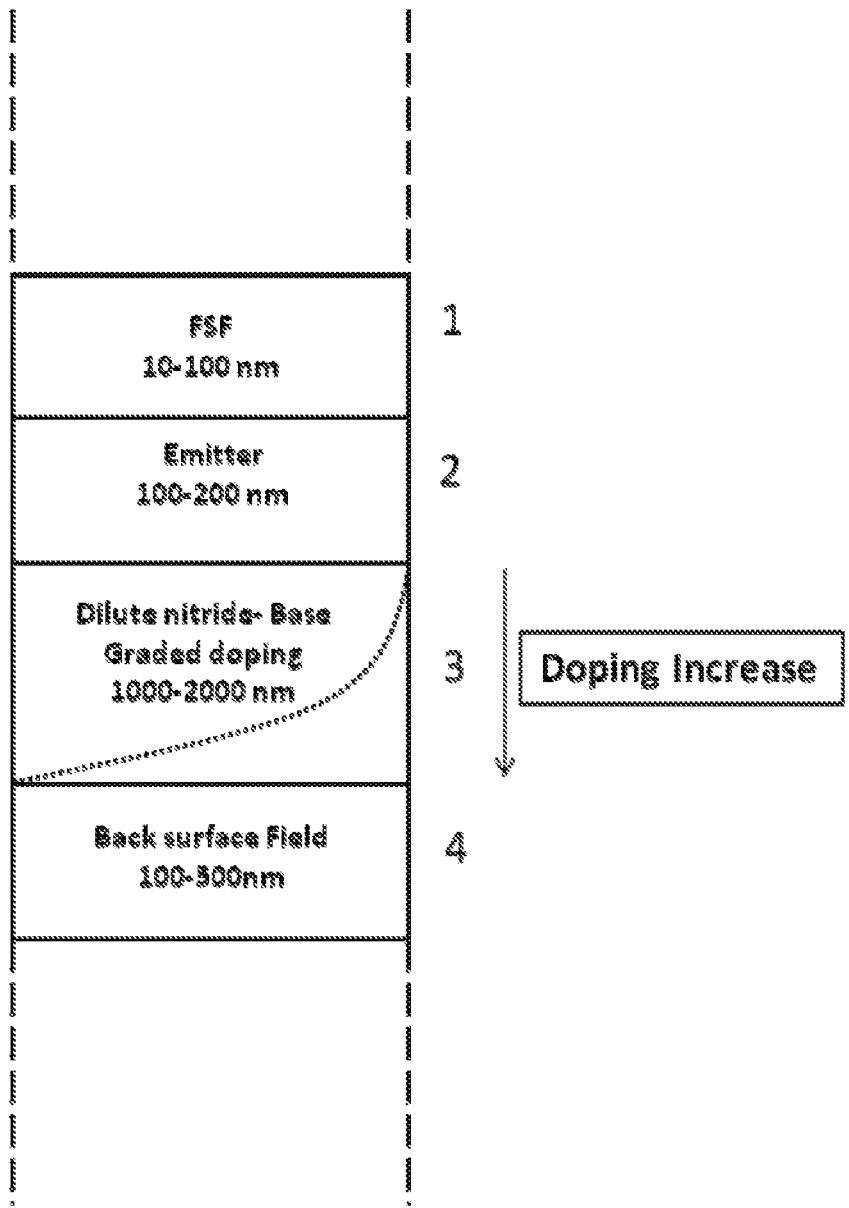
FIG. 5 shows a configuration with labels representing exemplary ranges of thicknesses that might be used for the various layers of a dilute nitride sub-cell that contained graded doping in the base.

FIG. 4 denotes exemplary cases in which the doping of the base 3 and the emitter 2 has either linearly graded dependence or exponentially graded dependence on the position as measured from the emitter-base junction. Multiple permutations using these exemplary cases can be obtained including an emitter having linear doping and a base having exponential doping and vice versa. Typically, the doping (i.e., impurity concentration) will lie substantially between $1\times10^{15}/cm^3$ and $1\times10^{19}/cm^3$, where the lowest doping level is nearest to the emitter-base junction (2-3) and the highest doping level is furthest from the emitter-base junction (1-2) and/or (3-4). In this embodiment, such a positional dependence of doping introduces an electric field in addition to the built-in electric field at the emitter-base junction 2-3. The minority carriers generated by the photovoltaic effect in the sub-cell structure demonstrated in FIG. 4 will be affected by such an electric field. The exact profile of the doping can be varied to introduce an optimized field for substantial improvement in minority carrier collection. This internal field has been determined to improve the current and/or voltage of the solar cell compared to a solar cell with uniform doping. It is determined by this invention that, in dilute nitride-type cells, graded doping is advantageous, as compared to the previously accepted best practice of using a wide intrinsic, i.e., undoped, region to enhance carrier collection, because it yields higher short circuit current, higher open circuit voltage and better fill factors. Some specific examples follow:

Referring to FIG. 5, consider the population of a dopant that increases in the base 3 from the front of the emitter-base junction (between layers 2 and 3) to the back 4, away from the emitter-base junction (between layers 3-4). The graded doping profile is shown as marked by dotted line in the base 3 of the dilute nitride sub-cell in FIG. 4. This doping profile assists in minority carrier collection by creating an additional field to push minority carriers to the front of the junction. An exponential doping profile introduces a constant electric field in the base. Linear and other doping profiles may also be used with differing effects. Varying the doping profile changes the electric field as a function of the position in the base 3 and improves current collection correspondingly. In this embodiment, the electric field drives the minority carriers away from the interface at the back of the cell (3-4), which may have a high recombination velocity as mentioned above.

Figure 7:
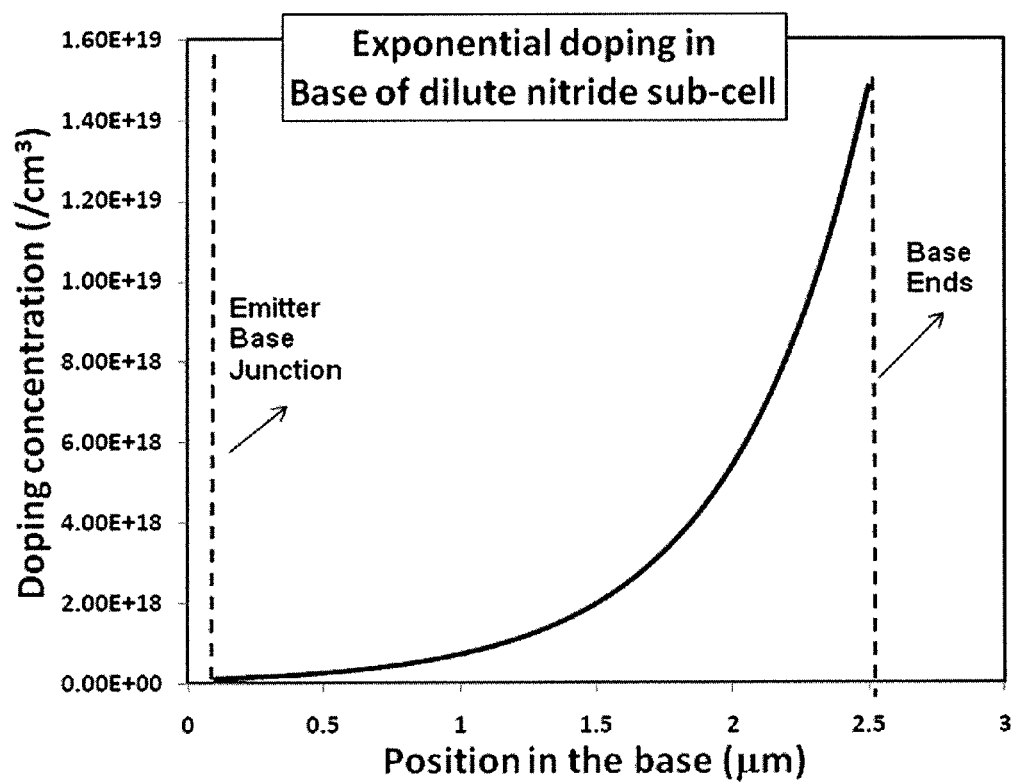
FIG. 7 is a graph of an exemplary doping profile in the base layer of a dilute nitride sub-cell of a structure as shown in FIG. 5.

An example of such a doping profile is illustrated by the graph of FIG. 7, wherein an example of the exponential doping with depth is depicted, the least dopant being at the base-emitter junction. As an exemplary case where the dopant concentration varies in a manner as explained in connection with FIG. 7, during manufacturing the dopant flux impinging the epitaxial surface during growth is changed exponentially, keeping other variable parameters as constant. For example, the doping is given by:

$$Doping = A \cdot e^{Bx};$$

where $A=1\times10^{15}/cm^3$ to $2\times10^{17}/cm^3$, $B=0.1/\mu m$ to $10/\mu m$ and x is depth.

Using this range would yield doping between $1\times10^{15}/cm^3$ and $1\times10^{19}/cm^3$ depending on the base thickness. In each case, the dopant flux is minimum at the emitter/base junction. The value of the flux is preset to attain a desired value of the dopant concentration in the epitaxial layer. FIG. 5 also outlines the typical thicknesses of the various layers used for the dilute nitride sub-cell. In FIG. 5 the back surface field 4, base 3, emitter 2 and the front surface field 1 layers have thicknesses in the range of 100-500 nm, 1000-2000 nm, 100-200 nm and 10-500 nm, respectively.

Figure 6:
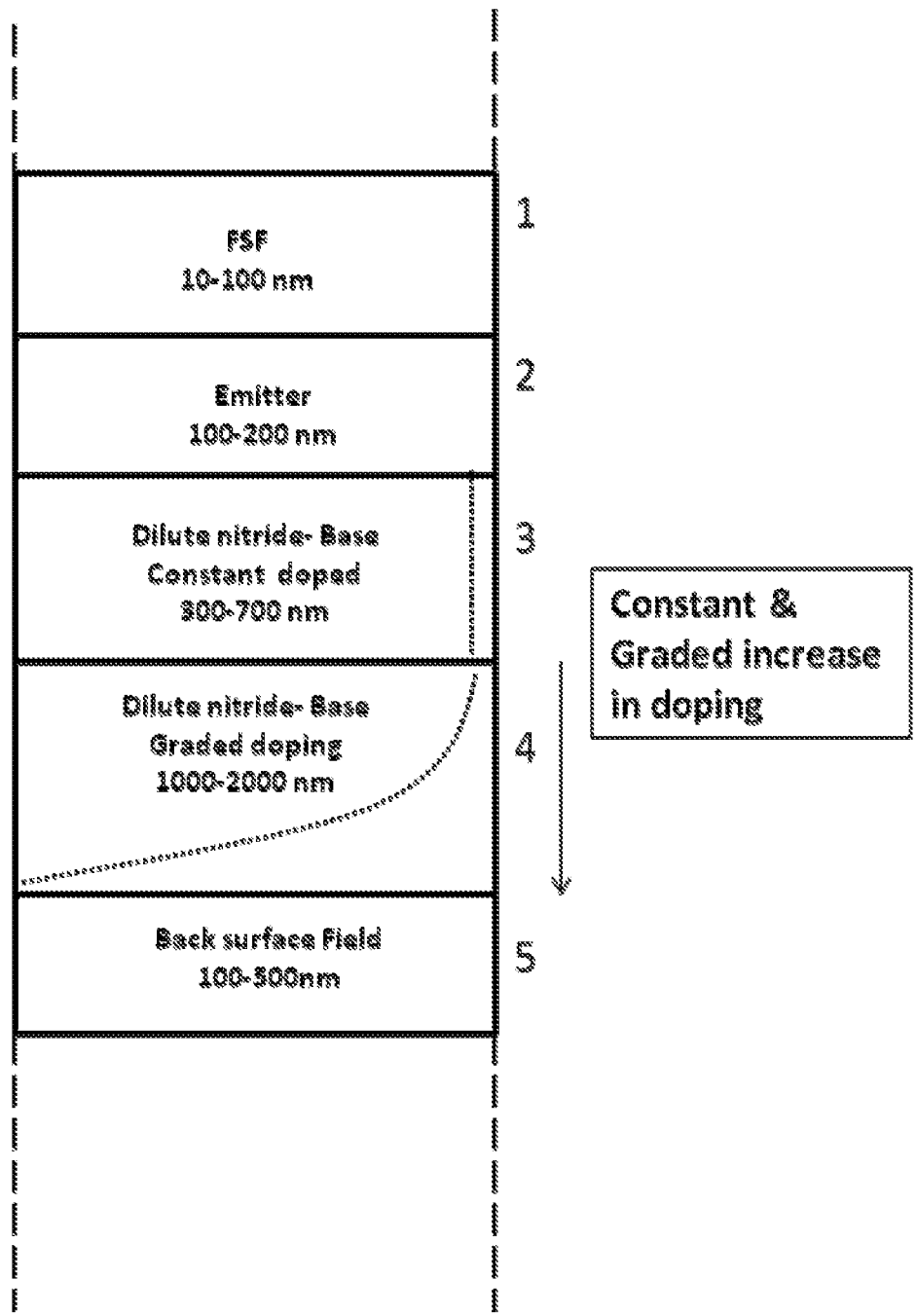
FIG. 6 shows a configuration with labels representing how a dilute nitride base layer could contain both constant doping for one sub-region and graded doping for another sub-region.

Referring to FIG. 6, the positional dependence of the doping is developed in such a way that the base layer has two sub-regions 3 and 4. The region closer to the front (i.e., the top) of the emitter-base junction (layer 3 in FIG. 6) has constant doping or no doping, as illustrated by the dotted line in sub-region 3. For example, the doping is given by Doping=A;

where A is a constant and ranges from 0 to $2 \times 10^{17}/cm^3$, The remainder of the base has a doping profile that varies as a function of position in a manner similar to that explained for the previously described embodiment and as illustrated by the dotted line in sub-region 4 of this figure. Using this would yield doping between $1 \times 10^{15}/cm^3$ and $1 \times 10^{19}/cm^3$ in the base for a thickness of 0 μm to 3 μm of the base.

Figure 8:
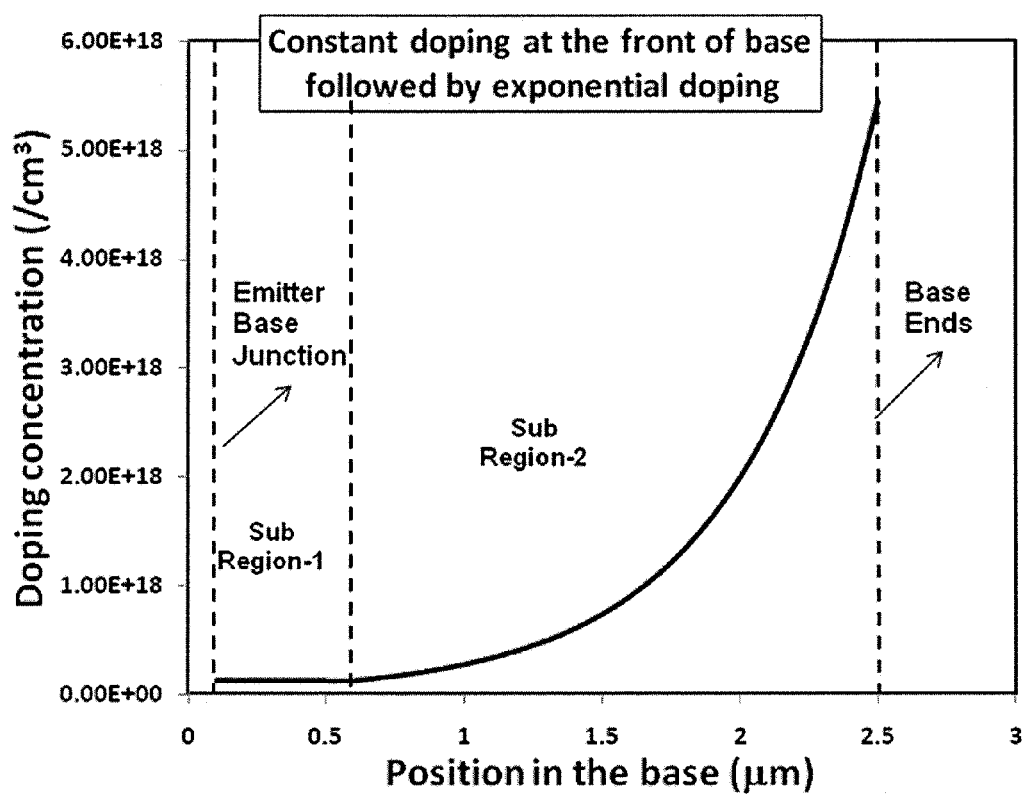
FIG. 8 is a graph of an exemplary doping profile of a dilute nitride sub-cell that contains constant doping in the front portion of the base layer and exponential doping in the back portion of the base layer.

The thickness of each sub-region can be varied in order to optimize the current and voltage output of the sub-cell. In particular, the optimal thicknesses will be different for different dilute nitride materials, and as the composition of the dilute nitride material changes. An example of such a doping profile is shown in FIG. 8. Sub-region 1 has either constant doping or is undoped. This region is closer to the emitter-base junction. Sub-region 2 has graded doping which varies exponentially as a function of the depth position in the sub-region 2. The position is measured with respect to the emitter-base junction. As an exemplary case where the dopant concentration varies in a manner as explained in connection with FIG. 8, the dopant flux is maximum at the instant when the back of the base is grown. In a typical structure, the back of the base is grown first, and then the dopant flux is changed in a manner so that it exponentially decreases as the remainder of the base is grown. Note that during epitaxy, layer 4 is typically grown first followed by layers 3 and 2 in FIG. 6. The dopant flux is the least at the interface between sub-region 1 and sub-region 2. Thereafter either the dopant flux is turned off or kept constant. The doping profile is varied in this manner in order to gain additional current due to a larger depletion width created by the undoped or uniformly doped region. The remainder of the base has positional (depth) dependent doping so as to introduce a drift field to further improve current collection. Furthermore, the extension of the depletion width by introduction of region of constant doping or no doping as opposed to the case with graded doping in the entire base ensures a higher probability of current collection for carriers generated outside of the depletion region of the solar cell. A substantial improvement in current collection is achieved in these embodiments. In some embodiments, the layer with this doping profile may comprise GaAs, InGaP, AlInGaP, AlGaAs or InGaAs.

Figure 10:
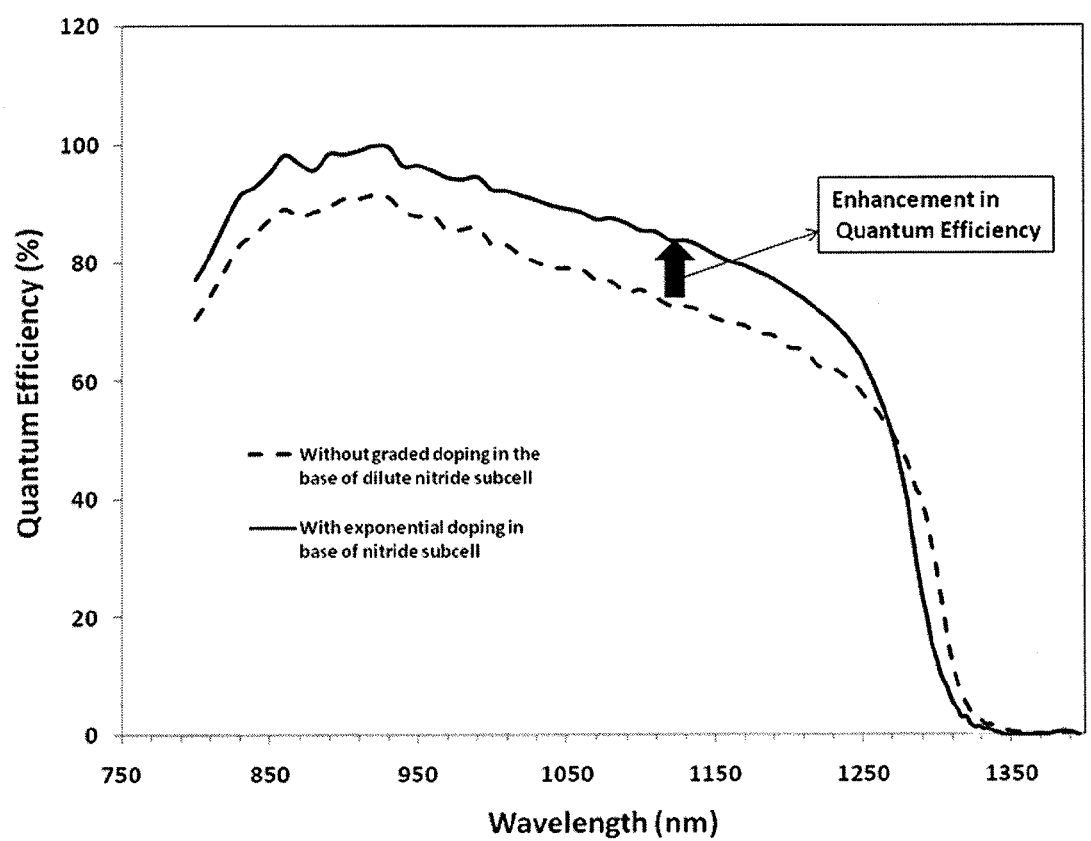
FIG. 10 is a graph illustrating comparison of the measured quantum efficiency of a dilute nitride sub-cell having graded doping in the base with that of a sub-cell without the graded doping.
Figure 11:
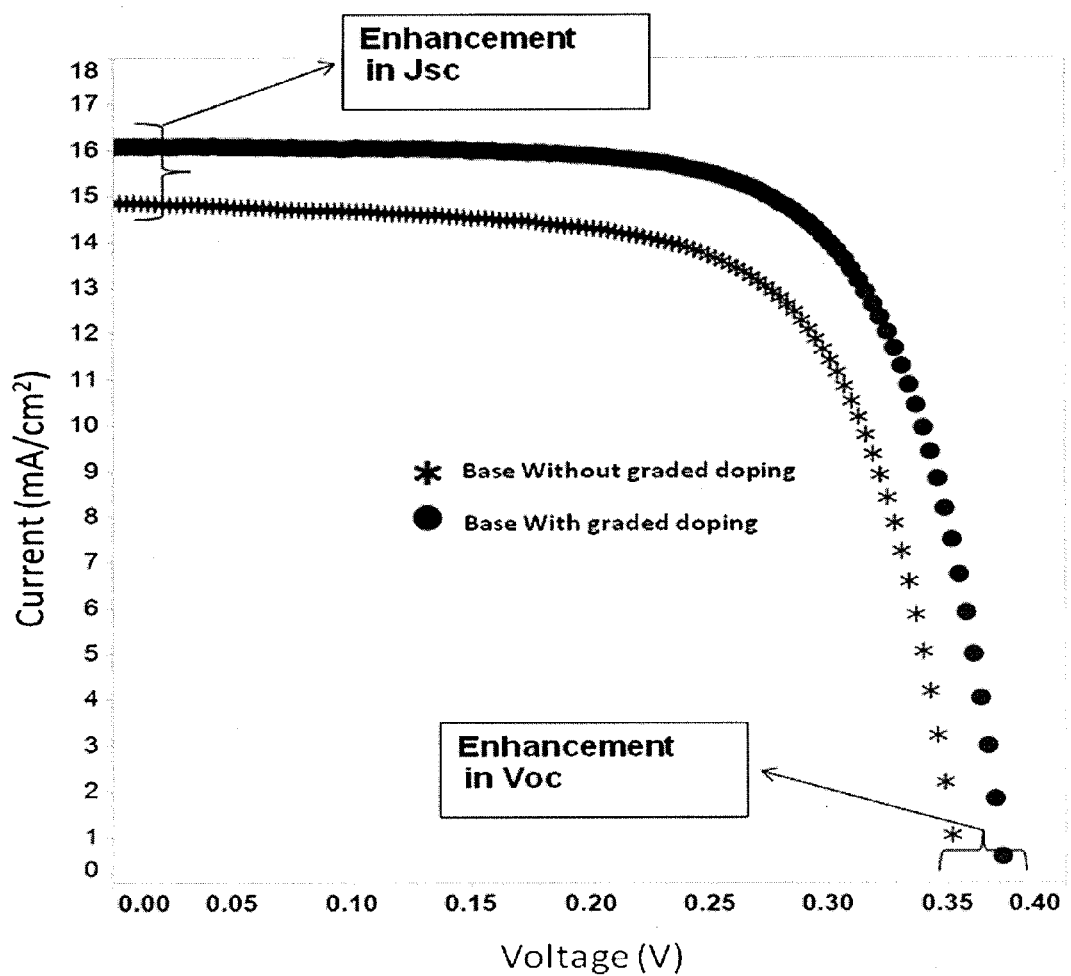
FIG. 11 is a graph illustrating a measured current versus voltage characteristic in comparison to the short circuit current and the open circuit voltage for a dilute nitride sub-cell having graded doping in the base with that of one not having graded doping.

FIG. 10 is a graph that compares the internal quantum efficiency of a dilute nitride sub-cell with and without use of a position dependent doping profile. Internal quantum efficiency is the ratio of the number of carriers collected by the solar cell to the number of photons of a given wavelength that enter the solar cell (i.e., photons that are reflected from the surface are excluded). If all photons of a certain wavelength are absorbed and the resulting carriers are collected, then the internal quantum efficiency at that particular wavelength is unity. The quantum efficiency measurements showed an approximately 8.5% increase in current under an AM1 5D spectrum as a result of the doping, which would translate to an increase of approximately 8.5% in the overall efficiency of the multi-junction solar cell if the dilute nitride sub-cell were the current limiting cell. With the use of the invention, there is a substantial improvement in the current collection and thus an improvement in the overall efficiency of the solar cell. In this particular demonstration, the short circuit current improves by 8.5% under an AM1 5D spectrum. Similar improvement can also be seen in FIG. 11, which shows the I-V characteristics of dilute nitride sub-cells. The open circuit voltage, short circuit current and the fill factor show substantial improvement in a sub-cell with a graded doping profile when compared to sub-cell without such a doping profile. The substantial improvement in the current and the voltage of the dilute nitride sub-cell translates directly into an improvement in the efficiency of the multi-junction solar cell. This improvement is significantly higher than a dilute nitride sub-cell without graded doping in the base and/or emitter of the dilute nitride sub-cell.

In the embodiment of the invention discussed above, the variations in doping profile are achieved during epitaxial growth of the semiconductor layers. In addition to the creation of the preferred doping profile during epitaxial growth, the profile may also be manipulated by post growth steps on the semiconductor epilayer. Such post growth steps include but are not limited to annealing the semiconductor material in an atmosphere comprising one or more of the following: As, P, $H_2$, $N_2$, forming gas, and/or $O_2$. Such a process step has multiple variables that must be optimized to achieve a desired doping profile. This includes but is not limited to changing the anneal time, anneal temperature, anneal cycle in addition to anneal environment mentioned above. For example, the anneal temperature may be between 400° C. and 1000° C., while the duration of the annealing process may lie between 10 sec and 1000 sec, and the ambient condition can be a constant pressure atmosphere of primarily phosphorus, arsenic, hydrogen, oxygen and/or nitrogen. The final objective, irrespective of the process step used to achieve it, is a desirable doping profile for a certain composition of the dilute nitride material.

Figure 9:
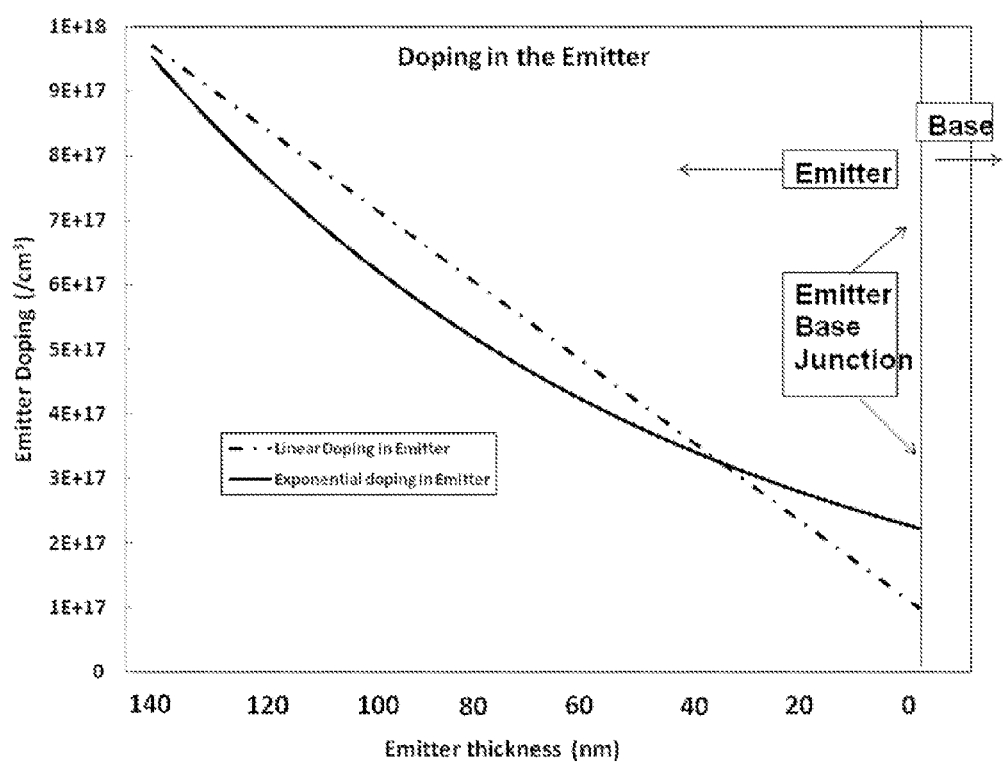
FIG. 9 is a graph of exemplary doping profiles of a dilute nitride sub-cell that contains graded doping in the emitter layer.

In still another embodiment of this invention, graded doping is introduced in the emitter of the dilute nitride solar cell. In this embodiment, the base may or may not have a graded doping profile according to the embodiments described above. The doping concentration of the emitter (layer 2 in FIG. 4) lies substantially between $1 \times 10^{15}/cm^3$ to $1 \times 10^{19}/cm^3$. The doping profile increases from the emitter-base junction (interface (2-3) in FIG. 5 and FIG. 6) towards the front surface field of the solar cell (interface (1-2) in FIG. 5 and FIG. 6). FIG. 9 outlines the doping in the emitter of the dilute nitride sub-cell. Two exemplary cases are given. In the first case, the doping changes linearly as a function of the position in the emitter. In the second case, such a variation in doping follows an exponential increase away from the emitter-base junction. For both the cases, the doping is the least at the emitter-base junction. The advantages of position dependent doping in the emitter are similar to those achieved from such doping in the base of the solar cell. In particular, the collection of minority carriers is improved, increasing the photocurrent. An exponential doping profile introduces a constant electric field in the emitter of the solar cell but linear and other doping profiles may also be used to create other fields of differing geometries. Variation in the doping profile is possible so as to change the electric field as a function of the position to improve current collection.

It should be noted that the embodiments specified above have specific profiles for doping that result in the creation of specific electric fields within the base and/or emitter of a dilute nitride solar cell. These examples are specified for illustration purposes and one skilled in the art can vary the doping profile in many other ways and configurations to achieve particular results. Recitation of these specific embodiments is not intended to limit the invention, which is set forth fully in the claims.

What is claimed is:

1. A multi-junction solar cell comprising a plurality of sub-cells, wherein:
    each of the plurality of sub-cells is lattice matched to adjacent sub-cells; and
    at least one of the plurality of sub-cells comprises a GaInNAsSb emitter, a GaInNAsSb base adjacent the GaInNAsSb emitter, and an emitter-base junction at an interface between the GaInNAsSb emitter and the GaInNAsSb base, wherein,
    the GaInNAsSb base comprises a base doping profile characterized by a base dopant concentration that increases with distance from the emitter-base junction; and
    the GaInNAsSb emitter comprises no doping or an emitter doping profile characterized by an emitter dopant concentration that increases with distance from the emitter-base junction.

2. The multi-junction solar cell of claim 1, wherein the base dopant concentration is between $1 \times 10^{15}/cm^3$ and $1 \times 10^{19}/cm^3$.

3. The multi-junction solar cell of claim 1, wherein the base doping profile increases exponentially over at least a portion of the distance from the emitter-base junction.

4. The multi-junction solar cell of claim 1, wherein the base doping profile increases linearly over at least a portion of the distance from the emitter-base junction.

5. The multi-junction solar cell of claim 1, wherein the base doping profile is selected to enhance the efficiency of the multi-junction solar cell compared to a multi-junction solar cell without the base doping profile.

6. The multi-junction solar cell of claim 1, wherein the emitter doping profile is selected to enhance the efficiency of the multi-junction solar cell compared to a multi-junction solar cell without the emitter doping profile.

7. The multi-junction solar cell of claim 1, wherein the plurality of sub-cells comprises a first sub-cell, a second sub-cell, and a third sub-cell, wherein,
    the first sub-cell comprises a GaInNAsSb sub-cell and is lattice matched to an underlying substrate, and is characterized by a first band gap;
    the second sub-cell overlies the first GaInNAsSb sub-cell and is lattice matched to the first sub-cell and is characterized by a second; and
    the third sub-cell overlies the second sub-cell and is lattice matched to the second sub-cell, and is characterized by a third bandgap; and
    the second band gap is higher than the first band gap and the third band gap is higher than the second bandgap.

8. The multi-junction solar cell of claim 1, wherein the GaInNAsSb base comprises a first doping subregion and a second doping subregion, wherein,
    the first doping subregion is adjacent the emitter-base junction and is characterized by a constant doping profile, and
    the second doping subregion is adjacent the first doping region and is characterized by a doping concentration that increases with distance from the emitter-base junction.

9. The multi-junction solar cell of claim 1, wherein the plurality of sub-cells comprises at least a first sub-cell, a second sub-cell, a third sub-cell and a fourth sub-cell, wherein,
    the first sub-cell is characterized by a first bandgap;
    the second sub-cell overlies the first sub-cell and comprises a GaInNAsSb base, wherein the GaInNAsSb base is lattice matched to the first sub-cell; and is characterized by a second bandgap that is greater than the first bandgap;
    the third sub-cell overlies the second sub-cell, is lattice matched to the second sub-cell, and is characterized by a third bandgap that is greater than the second bandgap; and
    the fourth sub-cell overlies the third sub-cell, is lattice matched to the third sub-cell, and is characterized by a fourth bandgap that is greater than the third bandgap.

10. A multi-junction solar cell comprising a plurality of sub-cells, wherein:
    each of the plurality of sub-cells is lattice matched to adjacent sub-cells; and
    at least one of the plurality of sub-cells comprises a GaInNAsSb emitter, a GaInNAsSb base adjacent the GaInNAsSb emitter, and an emitter-base junction at an interface between the GaInNAsSb emitter and the GaInNAsSb base, wherein,
    the GaInNAsSb base comprises a first subregion and a second subregion,
    the first subregion is adjacent the emitter-base junction and is not doped, and
    the second subregion is adjacent the first subregion and comprises a doping profile characterized by a doping concentration that increases with distance from the emitter-base junction.

11. A method for forming a GaInNAsSb subcell comprising a GaInNAsSb emitter, a GaInNAsSb base adjacent the GaInNAsSb emitter, and an emitter-base junction at an interface between the GaInNAsSb emitter and the GaInNAsSb base, wherein the method comprises:
    growing the GaInNAsSb base in an atmosphere containing a dopant, under growth conditions selected to provide a doping profile of the GaInNAsSb base characterized by a doping concentration that increases with distance from the emitter-base junction; and
    growing the GaInNAsSb emitter comprising no doping or an emitter doping profile characterized by an emitter dopant concentration that increases with distance from the emitter-base junction.

12. The method of claim 11 comprising annealing the GaInNAsSb sub-cell.

13. A method for forming a graded doping profile comprising:
    growing a GaInNAsSb base of a GaInNAsSb sub-cell of a multi-junction solar cell in an atmosphere containing a dopant, under growth conditions selected to provide a doping profile of the GaInNAsSb base characterized by a dopant concentration that increases with a distance from the emitter-base junction; and
    growing a GaInNAsSb emitter of a GaInNAsSb subcell of a multi-junction solar cell after growing the GaInNAsSb base, the GaInNAsSb emitter being grown in an atmosphere containing a dopant, the GaInNAsSb emitter comprising no doping or an emitter doping profile characterized by an emitter dopant concentration that increases with distance from the emitter-base junction.

14. The method of claim 13 comprising annealing the multi-junction solar cell containing the GaInNAsSb sub-cell.

15. The multi-junction solar cell of claim 1, wherein each of the plurality of sub-cells is lattice matched to each of the other sub-cells.

16. The multi-junction solar cell of claim 1, wherein at least one of the GaInNAsSb emitter and the GaInNAsSb base comprises a doping profile characterized by a dopant concentration that is lowest at the emitter-base junction and increases continuously with distance from the emitter-base junction.

* * * * *